United States Patent
Kariya

(10) Patent No.: US 9,984,851 B2
(45) Date of Patent: May 29, 2018

(54) ION IMPLANTER, MAGNETIC FIELD MEASUREMENT DEVICE, AND ION IMPLANTATION METHOD

(71) Applicant: Sumitomo Heavy Industries Ion Technology Co., Ltd., Tokyo (JP)

(72) Inventor: Hiroyuki Kariya, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 774 days.

(21) Appl. No.: 14/463,041

(22) Filed: Aug. 19, 2014

(65) Prior Publication Data

US 2015/0056366 A1 Feb. 26, 2015

(30) Foreign Application Priority Data

Aug. 21, 2013 (JP) .................................. 2013-170905

(51) Int. Cl.
*H01J 37/317* (2006.01)
*H01J 37/147* (2006.01)
(Continued)

(52) U.S. Cl.
CPC .......... *H01J 37/243* (2013.01); *G01R 33/07* (2013.01); *G01R 33/072* (2013.01); *H01J 37/147* (2013.01); *H01J 37/3171* (2013.01)

(58) Field of Classification Search
CPC ..... H01J 37/243; H01J 37/147; H01J 37/3171
See application file for complete search history.

(56) References Cited

U.S. PATENT DOCUMENTS 5,311,028 A * 5/1994 Glavish .................. G21K 1/093
250/396 ML
7,323,700 B1 * 1/2008 Ledoux ............... H01J 37/1474
250/396 ML
(Continued)

FOREIGN PATENT DOCUMENTS

JP H07-130324 A 5/1995
JP 3465221 B2 11/2003

OTHER PUBLICATIONS

Machine translation of JP,2000-011943.*
(Continued)

*Primary Examiner* — Jason McCormack
*Assistant Examiner* — Sean Luck
(74) *Attorney, Agent, or Firm* — Michael Best & Friedrich LLP

(57) ABSTRACT

An ion implanter includes an energy analyzer electromagnet provided between an ion source and a processing chamber. The energy analyzer electromagnet includes a Hall probe configured to generate a measurement output in response to a deflecting magnetic field and an NMR probe configured to generate an NMR output. A control unit of the ion implanter includes a magnetic field measurement unit configured to measure the deflecting magnetic field in accordance with a known correspondence between the deflecting magnetic field and the measurement output, a magnetic field determination unit configured to determine the deflecting magnetic field from the NMR output, and a Hall probe calibration unit configured to update the known correspondence by using the deflecting magnetic field determined from the NMR output and a new measurement output of the Hall probe corresponding to the determined deflecting magnetic field.

12 Claims, 11 Drawing Sheets

(51) Int. Cl.
*H01J 37/24* (2006.01)
*G01R 33/07* (2006.01)

(56) References Cited

U.S. PATENT DOCUMENTS

| | | | | |
|---|---|---|---|---|
| 7,525,314 B1 * | 4/2009 | Heiland | ............... | G01R 33/025 |
| | | | | 324/318 |
| 8,035,080 B2 * | 10/2011 | Satoh | ...................... | H01J 37/08 |
| | | | | 250/282 |
| 2003/0230732 A1 * | 12/2003 | Sasaki | ................ | G01R 19/0061 |
| | | | | 250/492.21 |
| 2008/0135776 A1 * | 6/2008 | Dzengeleski | .......... | B82Y 25/00 |
| | | | | 250/397 |
| 2010/0072994 A1 * | 3/2010 | Lee | ........................ | G01N 24/08 |
| | | | | 324/307 |
| 2011/0240875 A1 * | 10/2011 | Iwata | ...................... | A61N 5/10 |
| | | | | 250/397 |

OTHER PUBLICATIONS

High Accuracy Measurements with a Hall Probe C. Schott, R.S. Popovic, S. Alberti, M.Q. Tran LRP 623/98—Nov. 1998, Review of Scientific Instruments.*

* cited by examiner

200

ION IMPLANTER, MAGNETIC FIELD MEASUREMENT DEVICE, AND ION IMPLANTATION METHOD

BACKGROUND OF THE INVENTION

1. Field of the Invention

The present invention relates to an ion implanter, a magnetic field measurement device, and an ion implantation method.

2. Description of the Related Art

It is known that a nuclear magnetic resonance probe is used to measure a magnetic field of an energy analyzer magnet in ion implanters. Principally, the method of measuring a magnetic field using the nuclear magnetic resonance probe is errorless. Because the method is capable of measuring a magnetic field of an energy analyzer electromagnet accurately, an ion implanter capable of analyzing energy with high precision can be provided.

In the magnetic field measurement using a nuclear magnetic resonance probe, a nuclear magnetic resonance absorption frequency is identified by sweeping high-frequency magnetic fields within a certain frequency range. Because the method requires such frequency tracking, a relatively long period of time is required for the measurement. The magnetic field measurement is performed in an example situation when a magnetic field of the electromagnet is established according to a specified condition for implantation. The magnetic field measurement and subsequent current adjustment of the electromagnet based on the measurement are generally repeated until a desired magnetic field is established. By establishing a magnetic field early, the ion implantation process can start early as well. Consequently, productivity of the ion implanter is improved.

SUMMARY OF THE INVENTION

An illustrative purpose of an embodiment of the present invention is to provide an ion implanter and an ion implantation method capable of contributing to improvement in productivity in terms of magnetic field measurement.

According to an embodiment of the present invention, there is provided an ion implanter including: a beamline unit including an ion source and a processing chamber for processing a workpiece, the beamline unit configured to transport an ion beam from the ion source to the workpiece; and a control unit configured to control the beamline unit, wherein the beamline unit includes a deflecting electromagnet provided between the ion source and the processing chamber, wherein the deflecting electromagnet includes: a pair of electromagnets facing each other across an ion beam orbit so as to form a deflecting magnetic field for deflecting the ion beam; a magnetic field detection element provided between the pair of electromagnets and configured to output a measurement output in response to the deflecting magnetic field; and a nuclear magnetic resonance probe provided between the pair of electromagnets and configured to generate an NMR output, wherein the control unit includes: a magnetic field measurement unit configured to measure the deflecting magnetic field in accordance with a known correspondence between the deflecting magnetic field and the measurement output; and a magnetic field determination unit configured to determine the deflecting magnetic field from the NMR output; and a magnetic field detection element calibration unit configured to update the known correspondence by using the deflecting magnetic field determined from the NMR output and a new measurement output of the magnetic field detection element corresponding to the determined deflecting magnetic field.

According to an embodiment of the present invention, there is provided a magnetic field measurement device adapted for a deflecting electromagnet configured to form a deflecting magnetic field for deflecting a charged particle beam, the magnetic field measurement device including: a magnetic field detection element provided in the deflecting electromagnet so as to measure the deflecting magnetic field; and a nuclear magnetic resonance probe provided in the deflecting electromagnet so as to determine the deflecting magnetic field, wherein the magnetic field detection element is calibrated by using the nuclear magnetic resonance probe.

According to an embodiment of the present invention, there is provided an ion implantation method including: transporting an ion beam from an ion source to a workpiece; forming a deflecting magnetic field for deflecting the ion beam by using a deflecting electromagnet provided between the ion source and the workpiece; generating a measurement output in response to the deflecting magnetic field, by using a magnetic field detection element provided in the deflecting electromagnet; measuring the deflecting magnetic field in accordance with a known correspondence between the deflecting magnetic field and the measurement output; determining the deflecting magnetic field by using a nuclear magnetic resonance probe provided in the deflecting electromagnet; updating the known correspondence by using the deflecting magnetic field determined by using the nuclear magnetic resonance probe and a new measurement output of the magnetic field detection element corresponding to the determined deflecting magnetic field.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

The invention will now be described by reference to the preferred embodiments. This does not intend to limit the scope of the present invention, but to exemplify the invention.

A detailed description will now be given of the embodiments of the present invention with reference to the attached drawings. Like numerals represent like elements so that the description will be omitted accordingly. The configurations described below are by way of examples only and are non-limiting.

Figure 1:
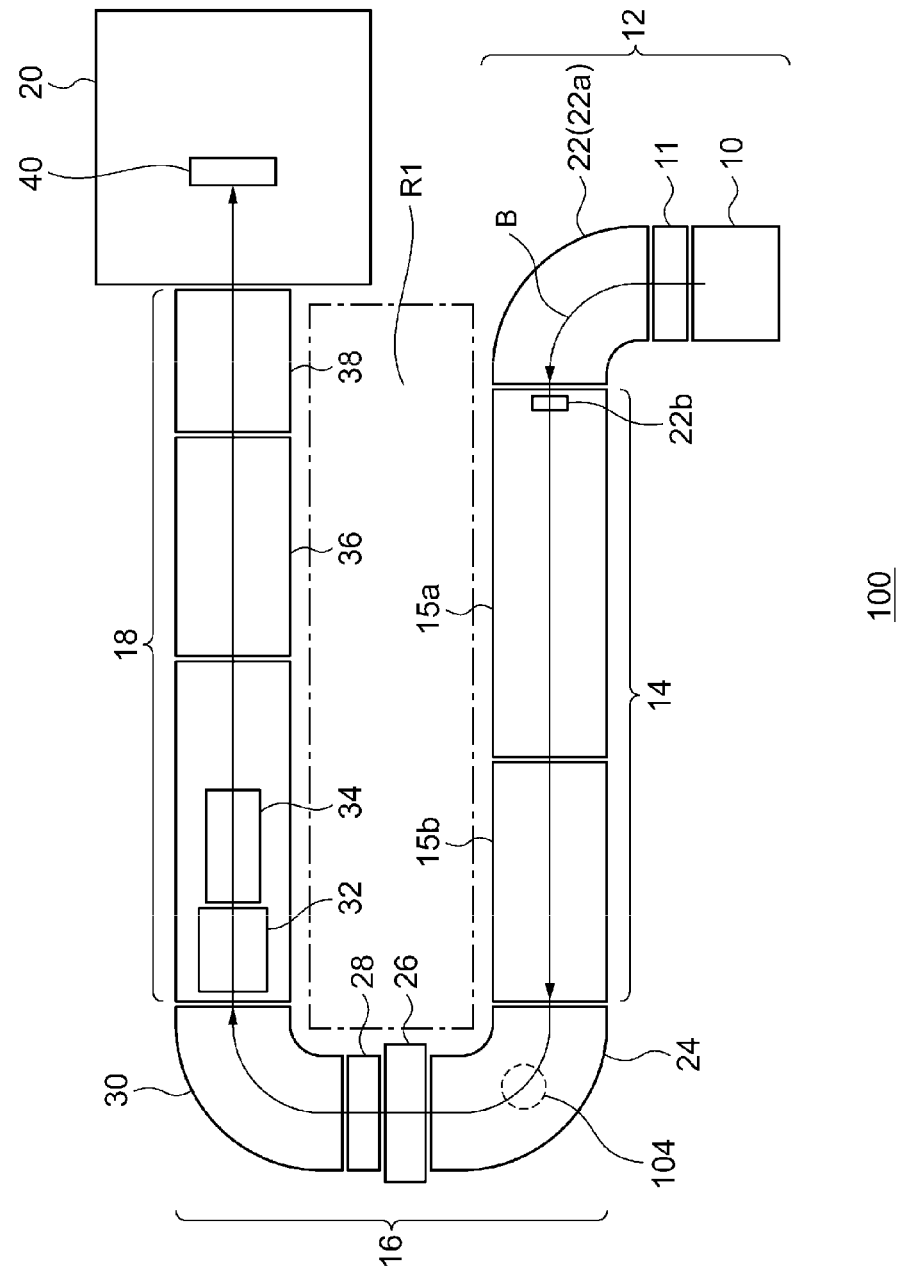
FIG. 1 is a schematic top view of an ion implanter according to an embodiment of the present invention.

FIG. 1 is a schematic top view of an ion implanter 100 according to an embodiment of the present invention. The ion implanter 100 is suitably used as a high energy ion implanter. The high energy ion implanter is provided with an ion accelerator of high-frequency linear acceleration type and a high energy ion transportation beamline. The high energy ion implanter accelerates ions generated by an ion source 10, transports a resultant ion beam B to a workpiece (e.g., a substrate or a wafer 40) along the beamline, and implants ions into the workpiece.

FIG. 1 shows a layout of components constituting a beamline unit of the ion implanter 100. The beamline unit of the ion implanter 100 comprises an ion source 10 and a processing chamber for processing the workpiece. The beamline unit is configured to transport the ion beam B from the ion source 10 to the workpiece. The beamline unit comprises at least one deflecting electromagnet placed between the ion source 10 and the processing chamber. Further, the ion implanter 100 comprises a control unit 102 configured to control the beamline unit (see FIG. 3).

As shown in FIG. 1, the high energy ion implanter 100 comprises an ion beam generation unit 12 configured to generate ions and subject the ions to mass separation; a high energy multistage linear acceleration unit 14 configured to accelerate the ion beam to obtain a high energy ion beam; a beam deflection unit 16 configured to analyze the energy of the high energy ion beam, adjust the central orbit thereof, and control the energy spread thereof; a beam transportation line unit 18 configured to transport the analyzed high energy ion beam to the wafer 40; and a substrate processing and supplying unit 20 configured to uniformly implant the transported high energy ion beam into a semiconductor wafer.

The ion beam generation unit 12 is provided with an ion source 10, an extraction electrode 11, and a mass analyzer 22. The ion beam generation unit 12 is configured to extract a beam from the ion source 10 via the extraction electrode 11 and accelerate the extracted beam. The extracted and accelerated beam is subject to mass analysis by the mass analyzer 22. The mass analyzer 22 is provided with a mass analyzer magnet 22a and a mass analyzer slit 22b. The mass analyzer slit 22b may be placed immediately after the mass analyzer magnet 22a. According to this embodiment, the mass analyzer slit 22b is placed inside the entrance of the high energy multistage linear acceleration unit 14 in the next stage.

Only the ion species necessary for implantation is selected in mass analysis by the mass analyzer 22. The ion beam comprised of the selected ion species is guided to the high energy multistage acceleration unit 14 in the next stage. The high energy multistage acceleration unit 14 comprises a first linear accelerator 15a including a plurality of stages of basic high-frequency resonators for high energy ion implantation. The high energy multistage linear acceleration unit 14 may comprise a second linear accelerator 15b including a plurality of additional stages of high-frequency resonators for ultra high energy ion implantation. The direction of the ion beam further accelerated by the high energy multistage linear acceleration unit 14 is changed by the beam deflection unit 16.

The beam deflection unit 16 comprises an energy analyzer electromagnet 24, a horizontal focusing quadrupole lens 26 configured to reduce energy spread, an energy analyzer slit 28, and a deflecting electromagnet 30 configured to provide steering (orbital adjustment). The energy analyzer electromagnet 24 may be referred to as an energy filter electromagnet (EFM). A magnetic field measurement device 104 is provided at the center of the energy analyzer electromagnet 24. The direction of the high energy ion beam is changed by the beam deflection unit 16, causing the high energy ion beam to travel toward the wafer 40.

The beam transportation line unit 18 is configured to transport the ion beam B exiting from the beam deflection unit 16 and is provided with a beam focusing/defocusing device 32 comprised of a group of focusing/defocusing lenses, a beam scanner 34, a beam parallelizer 36, a final energy filter 38 (including a final energy separation slit). The length of the beam transportation line unit 18 is designed to adapt to the total length of the ion beam generation unit 12 and the high energy multistage linear acceleration unit 14. The beam transportation line unit 18 is coupled to the assembly of the ion beam generation unit 12 and the high energy multistage linear acceleration unit 14 via the beam deflection unit 16, producing an overall U-shaped layout.

The substrate processing and supplying unit 20 is provided at the downstream end of the beam transportation line unit 18. In an implantation processing chamber of the substrate processing and supplying unit 20 are accommodated a beam monitor for measuring the ion beam B's beam current, position, angle of implantation, focusing/defocusing angle, and ion distribution in the vertical and horizontal directions; a static charge prevention device for preventing the wafer 40 from being charged by the ion beam B; a wafer transportation mechanism for transporting the wafer 40 into and out of the processing chamber and placing the wafer 40 at a proper position and angle; an electro static chuck (ESC) for supporting the wafer 40 during ion implantation; and a wafer scan mechanism for moving the wafer 40 during implantation in a direction perpendicular to the direction of beam scan at a speed determined by variation in the beam current.

Thus, the beamline unit of the ion implanter 100 is configured as a horizontal U-shaped folded-back beamline having two elongated straight portions facing each other. The upstream straight portion is comprised of a plurality of units for accelerating the ion beam B generated by the ion source 10. The downstream straight portion is comprised of a plurality of units for adjusting the ion beam B with its course changed from the course traveled in the upstream straight portion and implanting the ion beam B into the wafer 40. The two straight portions are configured to have substantially the same length. A work space R1 having a room sufficiently large for maintenance work is provided between the two straight portions.

In this way, the high energy ion implanter 100 that is formed by arranging the units in a U-shape ensures satisfactory workability while suppressing an increase in foot print. Further, in the high energy ion implanter 100, the units or the devices are formed as a module, and hence may be attached, detached, and assembled in accordance with the beamline reference position.

Since the high energy multistage acceleration unit 14 and the beam transportation line unit 18 are arranged in a folded-back layout, the overall length of the high energy ion implanter 100 is minimized. In the related-art devices, the units are arranged substantially in a linear layout. The radius of curvature of the plurality of deflecting electromagnets forming the beam deflection unit 16 is optimally configured to minimize the width of the implanter. These measures minimize the foot print of the implanter and makes it possible to do a maintenance work on the components of the high energy multistage linear accelerator unit 14 and the beam transportation line unit 18 in the work space R1 sandwiched by the high energy multistage linear acceleration unit 14 and the beam transportation line unit 18. Because the ion source 10, which is characterized by relatively short maintenance intervals, and the substrate processing and supplying unit 20, in which a substrate needs to be supplied/retrieved, are arranged adjacent to each other, an operator does not need to move a lot.

Figure 2:
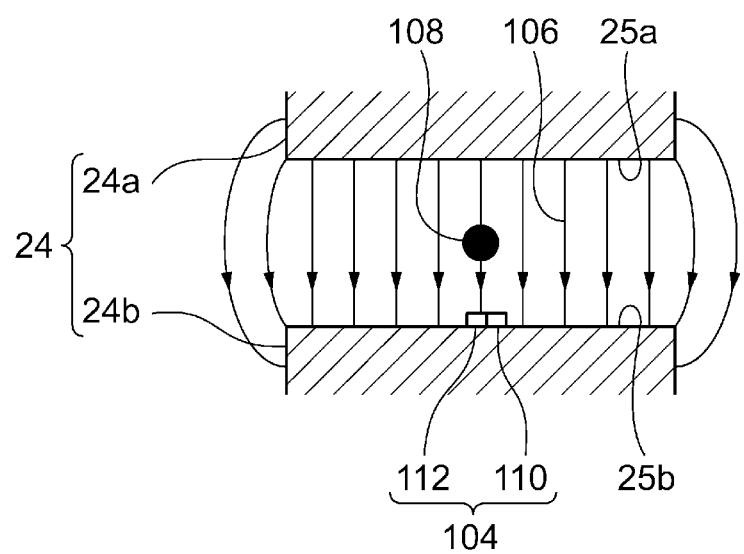
FIG. 2 shows a cross section of an energy analyzer magnet according to an embodiment of the present invention.

FIG. 2 shows a cross section of the energy analyzer electromagnet 24 according to an embodiment of the present invention. The energy analyzer electromagnet 24, which exemplifies a deflecting electromagnet, comprises a pair of electromagnets 24a and 24b facing each other. The electromagnets 24a and 24b face each other across an ion beam orbit 108. The ion beam orbit 108 represents the central orbit of the ion beam. The energy analyzer electromagnet 24 forms a deflecting magnetic field 106 between the electromagnets 24a and 24b to deflect the ion beam. The deflecting magnetic field 106 originates magnetic flux directed from one of the electromagnets 24a and 24b to the other.

The magnetic field measurement device 104 measures the magnetic field of the energy analyzer electromagnet 24. Because the precision of the magnetic field required of the energy analyzer electromagnet 24 is high (e.g., non-uniformity of the magnetic field of less than 0.01%), the magnetic field measurement device 104 is configured to measure a magnetic field with high precision.

The magnetic field measurement device 104 comprises a nuclear magnetic resonance (NMR) probe 112 and a Hall probe 110. The NMR probe 112 is used to calibrate the Hall probe 110, and the Hall probe 110 is used in a feedback control for a constant magnetic field. Details will be discussed later. The Hall probe 110 is used for a real time control of the magnetic field of the energy analyzer electromagnet 24. The magnetic field measurement device 104 comprises a detector unit including the Hall probe 110 and the NMR probe 112. The detector unit is placed between the pair of electromagnets 24a and 24b. The NMR probe 112 and the Hall probe 110 may be referred to as a NMR element and a Hall element, respectively.

The magnetic poles of the energy analyzer electromagnet 24 are arranged as parallel magnetic poles. One electromagnet 24a comprises a first magnetic pole surface 25a being flat, and the other electromagnet 24b comprises a second magnetic pole surface 25b facing the first magnetic pole surface 25a and parallel to the first magnetic pole surface 25a. The deflecting magnetic field 106 is perpendicular to the first magnetic pole surface 25a and the second magnetic pole surface 25b in the central area, which excludes the areas around the edges of the magnetic poles. The NMR probe 112 and the Hall probe 110 are placed at the center of the second magnetic pole surface 25b. Thus, the NMR probe 112 is disposed adjacent to the Hall probe 110 in an area characterized by small magnetic gradient, i.e., an area of substantially zero spatial variation in magnetic flux density. The NMR probe 112 and the Hall probe 110 may be placed at the center of the first magnetic pole surface 25a.

Preferably, the NMR probe 112 is placed immediately below (or immediately above) the ion beam orbit 108 subject to measurement. This can achieve the magnetic field at the location of the NMR probe 112 that matches the magnetic field in the ion beam orbit 108. The Hall probe 110 may also be placed immediately below (or immediately above) the ion beam orbit 108. In this way, the magnetic field in the ion beam orbit 108 can be directly measured.

The Hall probe 110 exemplifies a magnetic field detection element. The magnetic field detection element is configured to generate a measurement output in response to the deflecting magnetic field 106. The measurement output is an electric signal output from the magnetic field detection element due to the effect of the deflecting magnetic field 106. The Hall probe 110 generates a measurement output in the form of a voltage produced by the Hall effect (hereinafter, referred to as Hall output). The Hall output is substantially proportional to the deflecting magnetic field 106. In other words, slight non-linearity may be produced between the magnetic field and the Hall output.

When the magnetic field undergoes a change, the Hall output also changes instantly. For this reason, the Hall probe 110 has an advantage in that responsiveness to a magnetic field is extremely high. However, the Hall probe 110 has a drawback as well. The output from the Hall probe 110 can change with time. It is therefore desired to calibrate the Hall probe 110 periodically in order to maintain measurement precision. In ordinary calibration, it is required to re-define the relationship between the true magnetic field and the measurement output over the measurement range. During the calibration, the Hall probe 110 cannot measure a target magnetic field so that the ion implantation process should inherently be suspended until the calibration is completed. It is desired to avoid suspension of the process as much as possible in order to improve productivity of the ion implanter 100.

The NMR probe 112 is configured to generate an NMR output. The NMR output is a signal indicating a nuclear magnetic resonance absorption frequency. The NMR probe 112 measures a resonance absorption frequency of nuclear magnetic spin of an atomic nucleus (e.g., a hydrogen atom) that can be changed due to a magnetic field. The measurement by the NMR probe is ruled by the nature of an atomic nucleus so that an error such as time-dependent variation seen in the Hall probe 110 does not occur in principle. Therefore, the NMR probe 112 can perform high-precision measurement continuously and in a stable manner. However, the NMR probe 112 has a drawback in that the time required for measurement is relatively long. This is because the NMR probe 112 requires frequency tracking in order to identify the nuclear magnetic resonance absorption frequency.

Preferably, the magnetic field detection element is configured to generate a measurement output at a frequency higher than the frequency with which the NMR probe 112 generates an NMR output. This can achieve excellent real time measurement using a magnetic field detection element. In particular, the Hall probe 110 can output a Hall voltage continuously and so is suitable for real time measurement.

Figure 3:
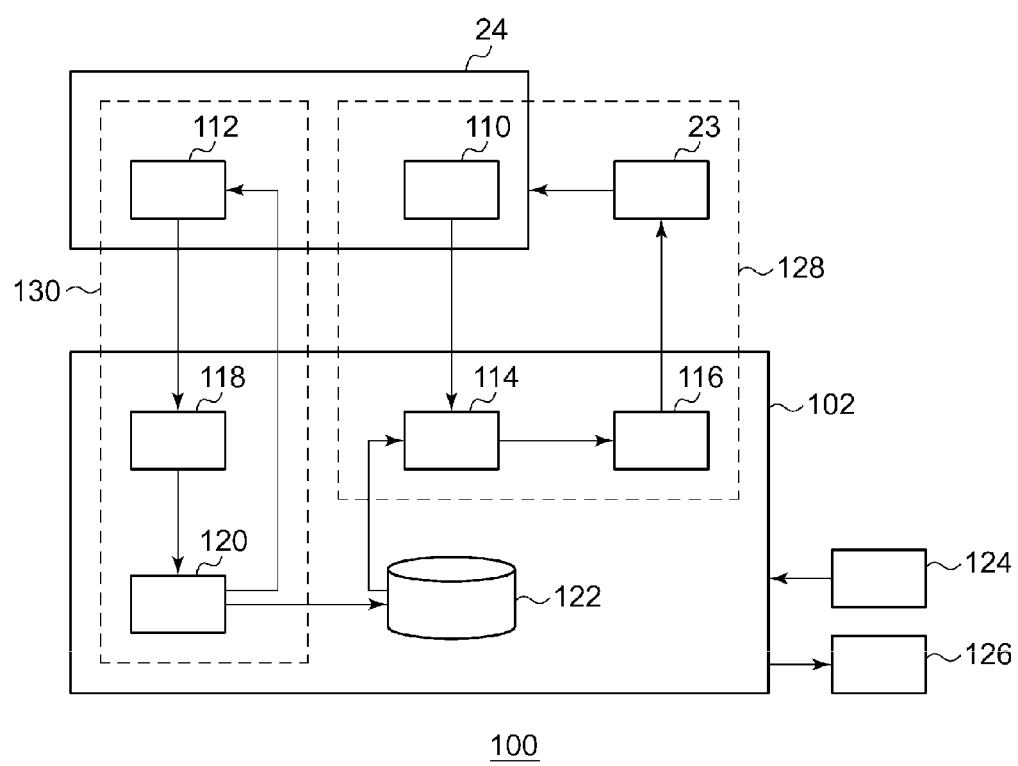
FIG. 3 is a block diagram illustrating the function and configuration of a control unit according to an embodiment of the present invention.

FIG. 3 is a block diagram illustrating the function and configuration of the control unit 102 according to an embodiment of the present invention. The blocks depicted here are implemented in hardware such as devices like a CPU of a computer or mechanical components, and in software such as a computer program etc. FIG. 3 depicts functional blocks implemented by the cooperation of these elements. Therefore, it will be obvious to those skilled in the art that the functional blocks may be implemented in a variety of manners by a combination of hardware and software.

The control unit 102 comprises a magnetic field measurement unit 114, a magnetic field adjustment unit 116, a magnetic field determination unit 118, a magnetic field detection element calibration unit (herein after, referred to as a Hall probe calibration unit) 120, and a storage 122. The control unit 102 is provided with an input unit 124 and an output unit 126. The input unit 124 is an arbitrary means for acknowledging input of information necessary for operation, and the output unit 126 is an arbitrary means for outputting (e.g., displaying) a result of operation. Further, the ion implanter 100 comprises a power supply 23 for the energy analyzer electromagnet 24. Referring to FIG. 3, the magnetic field measurement unit 114 and the magnetic field determination unit 118 form a part of the control unit 102. In an alternative embodiment, the Hall probe 110 may be provided with the magnetic field detection unit 114 and/or the NMR probe 112 may be provided with the magnetic field determination unit 118.

The magnetic field measurement unit 114 is configured to measure the deflecting magnetic field 106 in accordance with a known correspondence between the deflecting magnetic field 106 and the measurement output (in this embodiment, the Hall output). Hereinafter, the correspondence may be referred to as calibration data. The magnetic field measurement unit 114 converts the Hall voltage output from the Hall probe 110 into a measurement of the deflecting magnetic field 106 in accordance with the calibration data. The calibration data represents a calibration expression of the Hall probe 110.

For example, the magnetic field measurement unit 114 uses the following calibration expression to convert the output voltage of the Hall probe 110 into a magnetic field.

$$B = f(V)$$

where B denotes the deflecting magnetic field 106, V denotes the Hall output, and f(V) denotes the correlation between the magnetic field B and the voltage V. f(V) may be an arbitrary expression representing the correlation.

The calibration data includes measurement data representing a plurality of plots of calibration measurement and interpolation data for interpolation between the plots of calibration measurement. A plot of calibration measurement includes a Hall output V measured and the true deflecting magnetic field 106 corresponding to the measured Hall output V. In this embodiment, the magnetic field determined by using the NMR probe 112 is used as the true deflecting magnetic field 106. The interpolation data may represent linear interpolation between, for example, two adjacent plots of calibration measurement.

For example, the initial values of the calibration data is predefined by the manufacturer of the ion implanter 100. A total of n plots of calibration measurement (Vi, Bi) (i=1, 2, ..., n) are obtained in a predetermined measurement step before the ion implanter 100 manufactured is put into use. The measurement step may include varying the current supplied to the energy analyzer electromagnet 24 over a predetermined range (e.g., increasing the current in steps), concurrently measuring the Hall output Vi by the Hall probe 110, and measuring the corresponding magnetic field Bi by the NMR probe 112. The relational expression for linear interpolation between plots of calibration measurement is determined accordingly. The calibration data thus obtained is stored in the storage 122. The calibration data is read by the magnetic field measurement unit 114 as needed.

Figure 4:
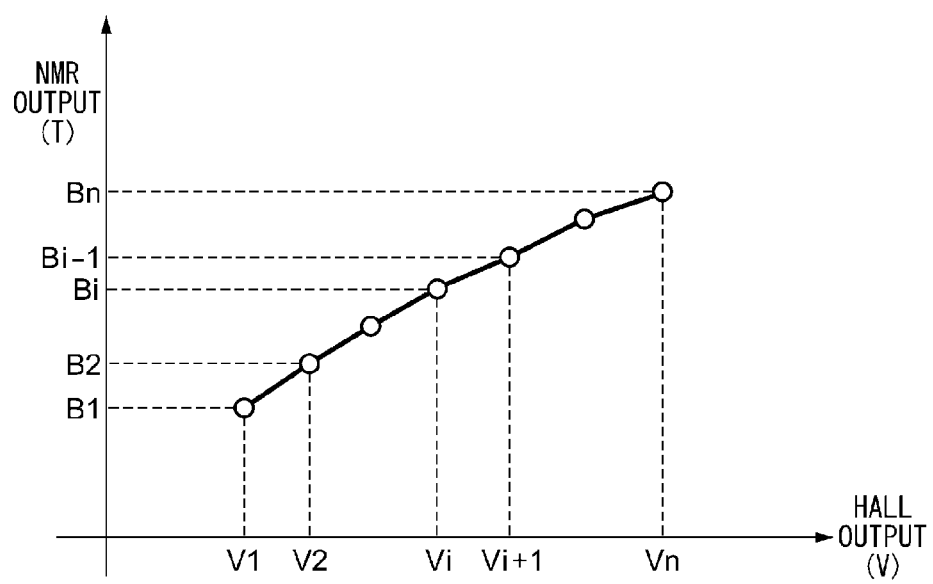
FIG. 4 is a graph showing an example of initial values of calibration data according to an embodiment of the present invention.

FIG. 4 is a graph showing an example of initial values of the calibration data according to an embodiment of the present invention. The magnetic field measurement unit 114 calculates the magnetic field B in a segment Vi–Vi+1 from the Hall output V according to the following expression. The magnetic field measurement unit 114 outputs the magnetic field B thus obtained to the magnetic field adjustment unit 116 as a measurement Bm of the deflecting magnetic field 106.

$$B = \frac{B_{i+1} - B_i}{V_{i+1} - V_i}(V - V_i) + B_i \qquad V_i \le V \le V_{i+1}$$

The magnetic field adjustment unit 116 is configured to adjust the deflecting magnetic field 106 to a target magnetic field B0 based on the measurement Bm of the deflecting magnetic field 106. The target magnetic field is set so as to cause the energy analyzer electromagnet 24 to deflect the ion beam and cause the energy analyzer slit 28 (see FIG. 1) to selectively transmit ions of a desired energy E (eV). The magnetic field adjustment unit 116 calculates the target magnetic field B0(T) according to the following expression.

$$B_O = \sqrt{\frac{E \times M}{4.824265 \times 10^7 \times n^2 \times \rho^2}}$$

where M denotes the mass of ions (amu), n denotes the valence of ions, and ρ denotes the radius of curvature of the beam in the energy analyzer electromagnet 24. The desired energy E, the mass M of ions, and the valence n of ions are values determined by the condition of ion implantation and are input to the control unit 102 via the input unit 124. The radius of curvature ρ is a constant given by the specification and may be similarly input to the control unit 102 via the input unit 124.

The magnetic field adjustment unit 116 controls the power supply 23 of the energy analyzer electromagnet 24 so that the measurement Bm of the deflecting magnetic field 106 matches the target magnetic field B0. The excitation current supplied to the coil of the energy analyzer electromagnet 24 is adjusted in this way so as to induce the target magnetic field B0 in the ion beam orbit 108 in the energy analyzer electromagnet 24.

As a result, when the ion beam having a given energy distribution enters the energy analyzer electromagnet 24, only those ions in a specified energy range are deflected along the ion beam orbit 108 and pass through the energy analyzer slit 28. Ions having a different energy are separated by collisions onto the energy analyzer slit 28 due to increase or decrease in the radius of deflection and hence they do not impinge upon the wafer 40.

Accordingly, the ion implanter 100 is provided with a feedback system capable of controlling the energy analyzer electromagnet 24 so that the magnetic field B0 corresponding to a predefined energy value E is established. The feedback system may be referred to as a magnetic field setting loop 128. The magnetic field setting loop 128 adjusts the deflecting magnetic field 106 to the target magnetic field B0 on a real time basis by reading the output from the Hall probe 110 continuously, converting the output into a magnetic field, and controlling the current in the energy analyzer electromagnet 24 by referring to the magnetic field. The ion implanter 100 is provided with the magnetic field setting loop 128 for real time adjustment. The magnetic field setting loop 128 is provided with the Hall probe 110, the magnetic field measurement unit 114, the magnetic field adjustment unit 116, the power supply 23, and the energy analyzer electromagnet 24.

As shown in FIG. 3, the ion implanter 100 is provided with another control loop aside from the magnetic field setting loop 128. Hereinafter, the loop will be referred to as a magnetic field detection element calibration loop or a Hall probe calibration loop 130. The Hall probe calibration loop 130 is provided to calibrate the Hall probe 110 using the NMR probe 112. The Hall probe calibration loop 130 is provided with the NMR probe 112, the magnetic field determination unit 118, and the Hall probe calibration unit 120.

Thus, the control unit 102 is configured to update the calibration data based on the NMR output independent of the measurement and/or adjustment of the deflecting magnetic field 106 based on the calibration data. The Hall probe calibration loop 130 can update the calibration data in parallel with the operation of the magnetic field setting loop 128.

The magnetic field determination unit 118 determines the deflecting magnetic field 106 from the NMR output. The NMR output supplied from the NMR probe 112 to the magnetic field determination unit 118 represents a nuclear magnetic resonance absorption frequency, as described above. The magnetic field determination unit 118 converts the NMR output into the deflecting magnetic field 106. In case the NMR probe 112 uses hydrogen atoms, the nuclear magnetic resonance absorption frequency f(Hz) and the magnetic field B(T) are related to each other by the following expression.

$$f = 4.2576 \times 10^7 \times B$$

The magnetic field determination unit 118 outputs the magnetic field B thus obtained to the Hall probe calibration unit 120 as indicating the true value of the deflecting magnetic field 106. In other words, the magnetic field determination 118 defines the deflecting magnetic field 106 determined from the NMR output as the true value of the deflecting magnetic field 106.

The Hall probe calibration unit 120 is configured to update the calibration data using the deflecting magnetic field 106 determined from the NMR output and a new measurement output from the Hall probe 110 corresponding to the determined deflecting magnetic field. Details of this process will be described later.

Figure 5:
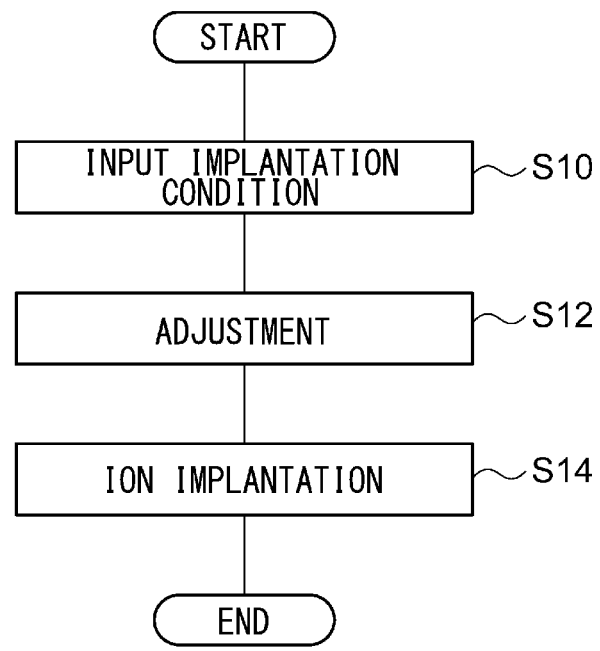
FIG. 5 is a flowchart showing an ion implantation method according to an embodiment of the present invention.

FIG. 5 is a flowchart showing an ion implantation method according to an embodiment of the present invention. As shown in FIG. 5, the ion implantation method includes an input step (S10), an adjustment step (S12), and an ion implantation step (S14). The method is executed by the control unit 102, like the method described later with reference to FIGS. 6 and 7.

In the input step (S10), a desired ion implantation condition is input to the control unit 102. This changes the previous implantation condition stored in the storage 102 into the implantation condition for the implantation process that should be performed next. The implantation condition includes the energy of the ion beam implanted into the wafer 40. The desired energy E of the energy analyzer electromagnet 24 is defined based on this energy for implantation.

The control unit 102 adjusts the components of the ion implanter 100 including the energy analyzer electromagnet 24 so that the ion implanter 100 generates the ion beam in accordance with the input implantation condition (S12). The energy analyzer electromagnet 24 is controlled so as to apply the target magnetic field B0 corresponding to the desired energy E to the ion beam orbit 108. Other steps to adjust the ion beam may be performed as needed. In this way, the preparation process for ion implantation is completed.

The control unit 102 performs the ion implantation process (S14). The wafer 40 is transported into the processing chamber and the wafer 40 is irradiated with the ion beam. Ions are implanted into the wafer 40 in accordance with the implantation condition. The wafer 40 is transported out of the processing chamber. The series of steps for transportation of the wafer 40 into and out of the processing chamber may be repeated until a predetermined number of wafers are processed. This method is then terminated.

As described above, the magnetic field of the energy analyzer electromagnet 24 is adjusted when the implantation condition is changed. However, the timing of adjustment is not limited to this. The deflecting magnetic field 106 may be monitored on a continuous basis during the operation of the ion implanter 100 or during the implantation process so that the magnetic field is timely adjusted as necessary.

Figure 6:
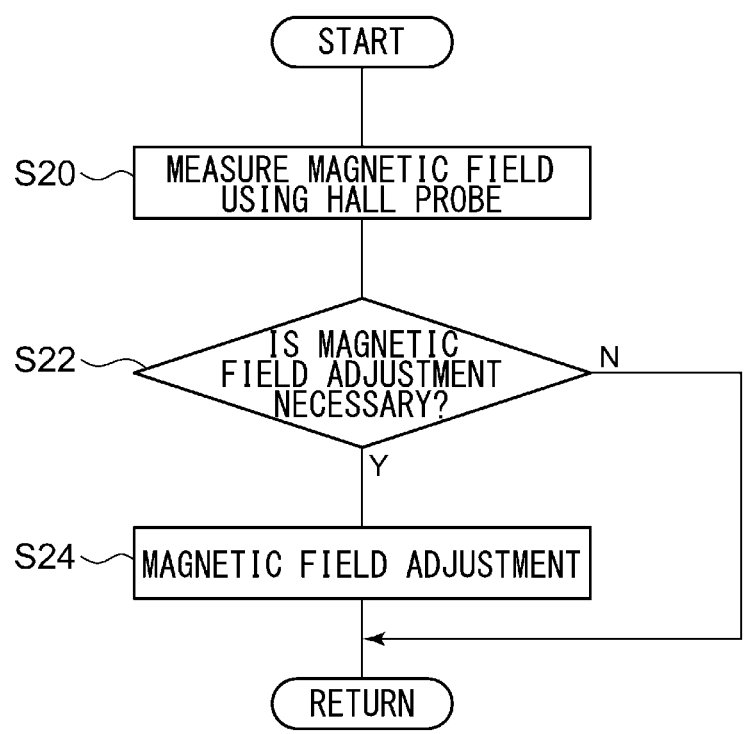
FIG. 6 is a flowchart showing a method of adjusting a magnetic field of an energy analyzer electromagnet according to an embodiment of the present invention.

FIG. 6 is a flowchart showing a method of adjusting the magnetic field of the energy analyzer electromagnet 24 according to an embodiment of the present invention. The method includes measuring the deflecting magnetic field 106 (S20), determining whether the magnetic field should be adjusted based on the measurement Bm and the target magnetic field B0 of the deflecting magnetic field 106, and adjusting the deflecting magnetic field 106 (S24). The method is periodically performed in order to maintain the deflecting magnetic field 106 at the target magnetic field B0.

The Hall probe 110 is used to measure the deflecting magnetic field 106 (S20). The magnetic field measurement unit 114 obtains the Hall output and determines the measurement Bm of the deflecting magnetic field from the Hall output, by using the calibration data.

The magnetic field adjustment unit 116 determines whether the measurement Bm of the magnetic field 106 matches the target magnetic field B0 (S22). For example, if the difference between the measurement Bm of the deflecting magnetic field and the target magnetic field B0 is less than a threshold, the magnetic field adjustment unit 116 determines that the measurement Bm of the deflecting magnetic field matches the target magnetic field B0 (N in S22). The threshold is defined to be a small value enough to determine that the measurement matches the target value. If the measurement Bm matches the target magnetic field B0, it is not necessary to adjust the magnetic field so that the method is terminated.

If it is determined that the measurement Bm of the deflecting magnetic field 106 deviates from the target magnetic field B0 (Y in S22), the magnetic field adjustment unit 116 controls the power supply 23 of the energy analyzer electromagnet 24 in order to adjust the deflecting magnetic field 106 (S24). For example, the amount by which the current is adjusted is determined based on the deviation of the measurement Bm from the target magnetic field B0. This adjusts the deflecting magnetic field 106 and the method is terminated. Whether the deflecting magnetic field 106 as adjusted matches the target magnetic field B0 is verified in the next round of the method.

Figure 7:
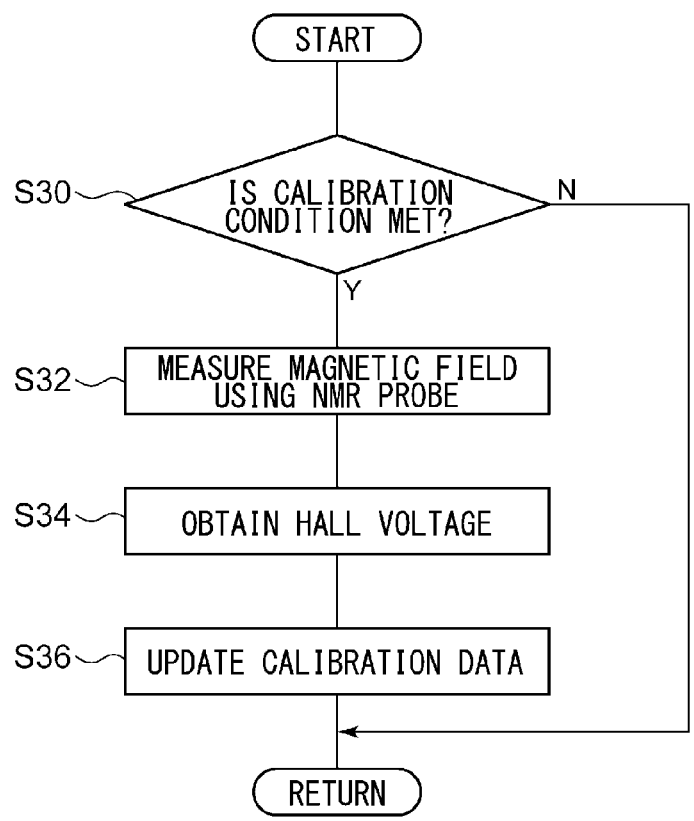
FIG. 7 is a flowchart showing a method of calibrating a magnetic field detection element according to an embodiment of the present invention.

FIG. 7 is a flowchart showing a method of calibrating the magnetic field detection element according to an embodiment of the present invention. The method includes determining whether to start calibration (S30), determining the deflecting magnetic field 106 using the NMR probe 112 (S32), obtaining the Hall output corresponding to the determined deflecting magnetic field 106 (S34), and updating the calibration data based on the relation between the determined deflecting magnetic field 106 and the corresponding Hall output (S36). The method is repeated periodically at a frequency lower than that of the method to adjust the magnetic field.

The Hall probe calibration unit 120 determines whether a condition to start calibration is met (S30). For example, the condition to start calibration may require that the adjustment step (S12 of FIG. 5) is being performed following a change in the implantation condition and/or that the magnetic field adjustment (S24 of FIG. 6) is completed and the magnetic field is in a stable state (e.g., a determination that there is no need to adjust the magnetic field (N in S22) continues for a predetermined duration up to the current moment). If it is determined that the condition to start calibration is not met (N in S30), the method is terminated. In this case, the calibration data is not updated and the initial data remains stored in the storage 122.

If it is determined that the condition to start calibration is met (Y in S30), the Hall probe calibration unit 120 measures the deflecting magnetic field 106 by operating the NMR probe 112 (S32). The NMR probe 112 performs frequency tracking so as to identify the nuclear magnetic resonance absorption frequency. The magnetic field determination unit 118 converts the nuclear magnetic resonance absorption frequency into the deflecting magnetic field 106.

Concurrently, the Hall probe calibration unit 120 obtains the output voltage of the Hall probe 110 (S34). The Hall probe calibration unit 120 correlates the Hall output Vnew occurring when the nuclear magnetic resonance absorption frequency is determined by frequency tracking performed by the NMR probe 112 with the magnetic field Bnew measured by the NMR probe 112. In this way, the Hall probe calibration unit 120 generates a new plot of calibration measurement (Vnew, Bnew).

The Hall probe calibration unit 120 uses the new plot of calibration measurement (Vnew, Bnew) to update the calibration data (S36). The Hall probe calibration unit 120 stores the updated calibration data in the storage 122. This completes the method.

Figure 8:
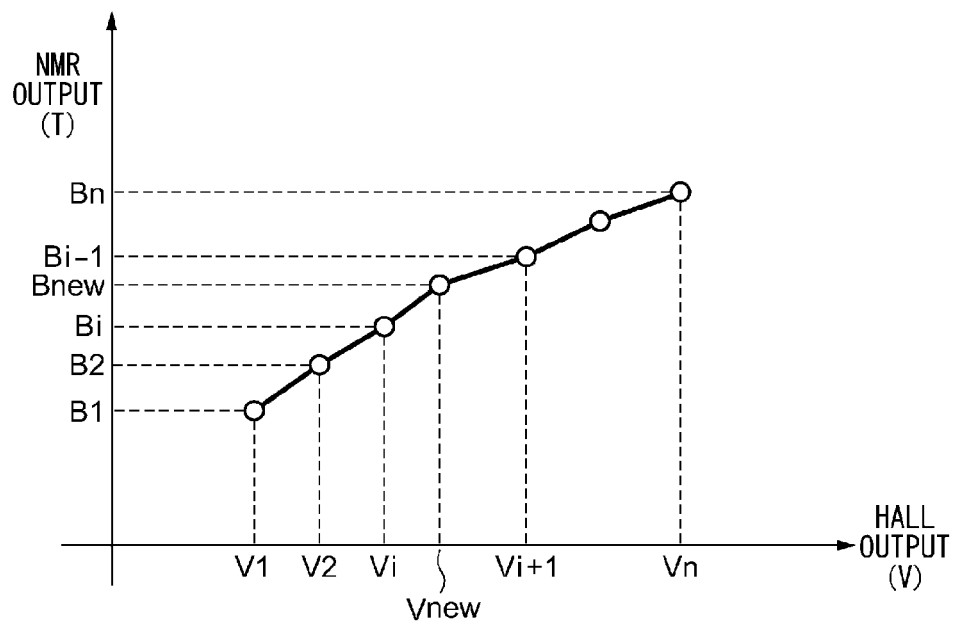
FIG. 8 is a graph illustrating an updated calibration data according to an embodiment of the present invention.

FIG. 8 is a graph illustrating an updated calibration data according to an embodiment of the present invention. As illustrated, the Hall probe calibration unit 120 adds the new plot of calibration measurement (Vnew, Bnew) to the original calibration data. The Hall probe calibration unit 120 also calculates a relational expression for linear interpolation between the new plot of calibration measurement (Vnew, Bnew) and the adjacent existent plot of calibration measurement and replaces the existent linear interpolation expression by the calculated relational expression.

Alternatively, the Hall probe calibration unit 120 may replace one of the plots of calibration measurement in the original calibration data (e.g., the plot of calibration measurement closest to the new plot of calibration measurement) by the new plot of calibration measurement (Vnew, Bnew). If the new plot of calibration measurement (Vnew, Bnew) is relatively close to any of the existent plots of calibration measurement, replacement may take place as described above, but, if the new plot of calibration measurement is relatively remote from the closest existent plot, the Hall probe calibration unit 120 may add a new plot of calibration measurement as described above.

The Hall probe calibration unit 120 may refer to the relative positions between the new plot of calibration measurement and the existent plot of calibration measurement and determine how the new plot of measurement is used to update the calibration data. For example, the Hall probe calibration unit 120 may determine whether to add the new plot of calibration measurement or replaces the closest existent plot of calibration measurement by the new plot of calibration measurement, by referring to the distance between the new plot of calibration measurement and the closest existent plot of calibration measurement.

The updated calibration data is read by the magnetic field measurement unit 114 immediately or at an appropriate subsequent point of time. For example, the magnetic field measurement unit 114 replaces the original calibration data by the updated calibration data when the ion implantation process is not performed. This allows the magnetic field measurement unit 114 to measure the deflecting magnetic field 106 in the next and subsequent implantation processes using the latest calibration data.

Replacement of the calibration data may mean change in the expression for calibration of the Hall output. Therefore, the replacement of the calibration data may cause an apparent change of the measurement Bm of the deflecting magnetic field 106 calculated by the magnetic field measurement unit 114. This does not correspond to an actual change in the magnetic field. Rather, the apparent change represents a change from a relatively inaccurate measurement based on the original calibration data to an accurate measurement based on the new calibration data. According to the above-described method to adjust the magnetic field, the deflecting magnetic field 106 is not only adjusted in response to the actual change in the magnetic field but is similarly adjusted in response to the apparent change. Consequently, the deflecting magnetic field 106 can be automatically and accurately adjusted in association with the update of the calibration data.

When the implantation condition is changed, adjustment of the magnetic field and update to the calibration data are performed in parallel as described below. First, the magnetic field is adjusted. In other words, the output voltage of the Hall probe 110 is monitored and the current in the energy analyzer electromagnet 24 is adjusted to produce the target magnetic field B0. When the adjustment is completed, measurement of the magnetic field by the NMR probe 112 is started and the calibration data is updated accordingly. In most cases, the update of the calibration data is completed before the adjustment of other characteristics of the ion beam is completed and hence the implantation process is still suspended at the completion of calibration. Thus, the deflecting magnetic field 106 can be adjusted again by using the updated calibration data. This allows ion implantation based on accurate energy analysis.

The Hall probe calibration unit 120 may determine whether the updated calibration data is within a permitted range defined in relation to the original calibration data. If it is determined that the updated calibration data is outside the permitted range, the control unit 102 may prohibit the ion implantation process from being started or suspends the ion implantation process being performed. Alternatively, the control unit 102 may output an alert indicating abnormality in the magnetic field measurement device 104.

The permitted range is defined to allow determination as to whether the updated calibration data significantly deviates from the original calibration data. For example, the permitted range may be defined based on the specification value that guarantees the precision of the Hall probe measurement system. If the new plot of calibration measurement (Vnew, Bnew) deviates from the original calibration data beyond a certain threshold, the Hall probe calibration unit 102 may determine that the updated calibration data is outside the permitted range.

If the new plot of calibration measurement (Vnew, Bnew) deviates significantly from the original data, the magnetic field measurement device 104 may be in trouble. By preventing the implantation process from being performed as described above, the implantation process with a wrong implantation energy can be prevented.

Figure 9:
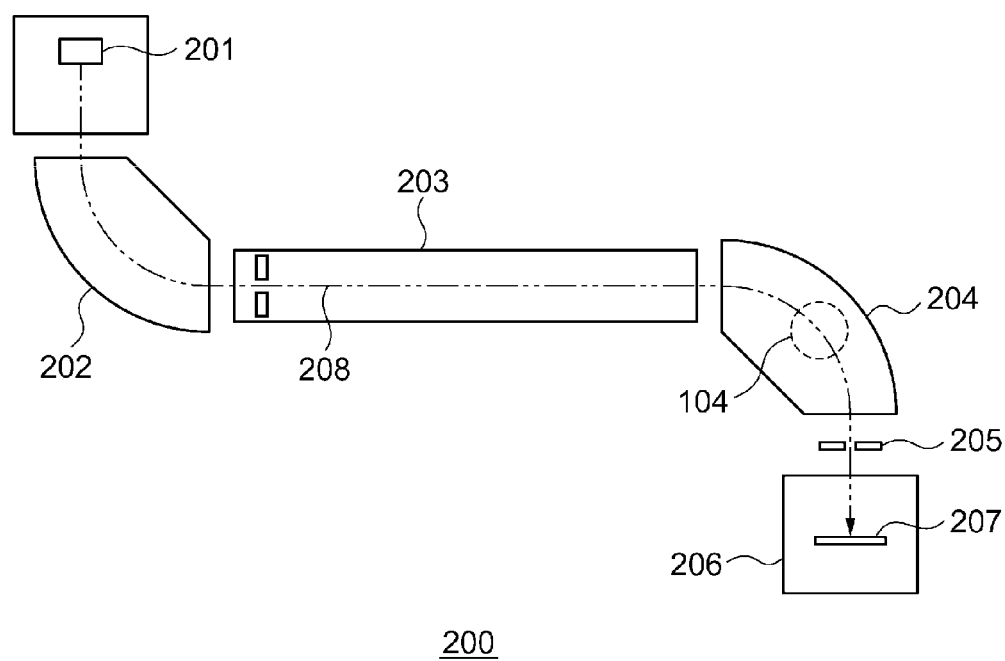
FIG. 9 is a schematic view of an ion implanter according to an alternative embodiment of the present invention.

FIG. 9 is a schematic view of an ion implanter 200 according to an alternative embodiment of the present invention. The ion implanter 200 is suitably used as a high energy ion implanter. The ion implanter 200 comprises an ion source 201, a mass analyzer electromagnet 202, a linear accelerator 203, an energy analyzer electromagnet 204, a resolution slit 205, and an implantation processing chamber 206. As in the ion implanter 100 described with reference to FIG. 1, the magnetic field measurement device 104 is provided in the energy analyzer electromagnet 204.

In the ion implanter 200, the extracted ion beam from the ion source 201 passes through the mass analyzer electromagnet 202. Only the necessary ion species of the ion beam is then guided to the linear accelerator 203. The energy of the ion beam is determined solely by the extraction voltage of the ion source 201 and the valence of ions, and hence is homogeneous (monochromatic). The linear accelerator 203 is capable of accelerating or decelerating ions in a high-frequency (RF) electric field. The high-frequency electric field effects the ion beam so that its energy spread at the downstream of the linear accelerator 203 is widened. To address this, the magnetic field of the energy analyzer electromagnet 24 is set and the resolution slit 205 is used for selection of energy so that only those ions with a desired energy can pass. The energy range that can be transmitted can be predefined by the aperture width of the resolution slit 205. Only those ions passing through the resolution slit 205 are guided to the implantation processing chamber 206 and used for implantation of the wafer 207. Numeral 208 denotes the central orbit of the ion beam.

Figure 10:
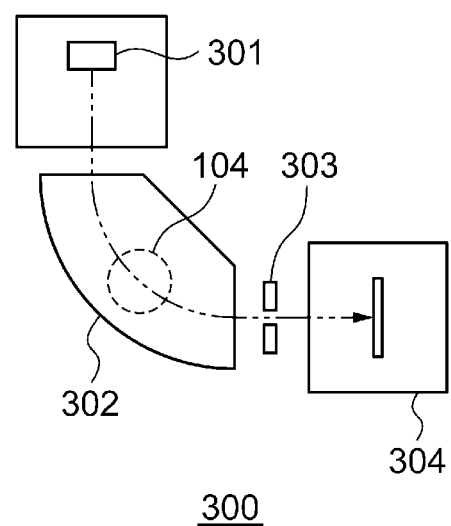
FIG. 10 is a schematic view of an ion implanter according to an alternative embodiment of the present invention.

FIG. 10 is a schematic view of an ion implanter 300 according to an alternative embodiment of the present invention. The ion implanter 300 comprises an ion source 301, a mass analyzer electromagnet 302, a resolution slit 303, and an implantation processing chamber 304. The magnetic field measurement device 104 may be provided in the mass analyzer electromagnet 302.

Figure 11:
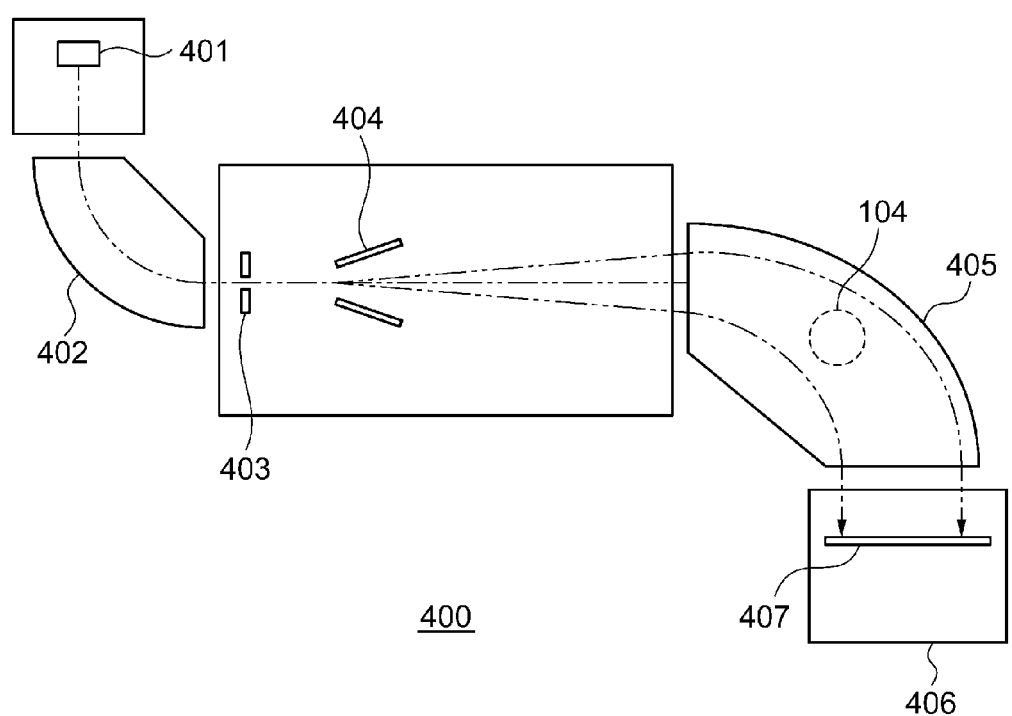
FIG. 11 is a schematic view of an ion implanter according to an alternative embodiment of the present invention.

FIG. 11 is a schematic view of an ion implanter 400 according to an alternative embodiment of the present invention. The ion implanter 400 comprises an ion source 401, a mass analyzer electromagnet 402, a resolution slit 403, a scanner 404, a parallelizing electromagnet 405, and an implantation processing chamber 406. The magnetic field measurement device 104 may be provided in the parallelizing electromagnet 405.

The ion implanter 400 extracts the ion beam from the ion source 401 and selects only the ion species having a mass required for implantation, by using the analyzer electromagnet 402 for the selection. The ion implanter 400 guides the selected ions to the scanner 404 that uses an electric field or a magnetic field for scanning. The beam is parallelized by the parallelizing electromagnet 405 that uses a magnetic field. The ion implanter 400 implants the parallelized ion beam into the wafer 407.

As described above, the ion beam implanter 100, 200, 300, 400 according to the embodiments monitors the deflecting magnetic field 106 of the energy analyzer electromagnet 24 by using the Hall probe 110 and, concurrently, calibrates the Hall probe 110 by using the NMR probe 112. Because the operation of the ion implanter 100, 200, 300, 400 does not need to be suspended for calibration, productivity of the implanter is not affected. Time-dependent change in the Hall probe 110 can be timely compensated for and precision of beam energy analyzed by the energy analyzer electromagnet 24 is improved while the operation of the ion implanter 100, 200, 300, 400 is continued.

Described above is an explanation based on the exemplary embodiments of the present invention. The invention is not limited to the above-mentioned embodiments, and various design modifications may be added. It will be obvious to those skilled in the art that such modifications are also within the scope of the present invention.

In the embodiments described above, the magnetic field detection element is exemplified as the Hall probe 110, but the type of magnetic field detection element is non-limiting. In certain embodiments, the magnetic field detection element may be a semiconductor magnetic sensor (e.g., a magnetoresistance element) other than the Hall probe 110. Alternatively, the magnetic field detection element may be any element capable of generating a measurement output in response to the deflecting magnetic field 106.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2013-170905, filed on Aug. 21, 2013, the entire content of which is incorporated herein by reference.

What is claimed is:

1. An ion implanter comprising:
   a beamline unit comprising an ion source and a processing chamber for processing a workpiece, the beamline unit configured to transport an ion beam from the ion source to the workpiece; and
   a control unit configured to control the beamline unit,
   wherein the beamline unit comprises a deflecting electromagnet provided between the ion source and the processing chamber,
   wherein the deflecting electromagnet comprises:
      a pair of electromagnets facing each other across an ion beam orbit so as to form a deflecting magnetic field for deflecting the ion beam,
      a magnetic field detection element provided between the pair of electromagnets and configured to output a measurement output in response to the deflecting magnetic field, and
      a nuclear magnetic resonance probe provided between the pair of electromagnets and configured to generate an NMR output,
   wherein the control unit comprises:
      a magnetic field measurement unit configured to measure the deflecting magnetic field in accordance with a known correspondence between the deflecting magnetic field and the measurement output,
      a magnetic field determination unit configured to determine the deflecting magnetic field from the NMR output,
      a magnetic field detection element calibration unit configured to determine whether a condition to start calibration is met and configured to update the known correspondence by using the deflecting magnetic field determined from the NMR output and a new measurement output of the magnetic field detection element corresponding to the determined deflecting magnetic field, and a storage configured to store a calibration data representing the known correspondence, wherein the magnetic field detection element calibration unit is configured such that, if the condition to start calibration is not met, the calibration data is not updated and remains stored in the storage and such that, if the condition to start calibration is met, the calibration data is updated.

2. The ion implanter according to claim 1, wherein the magnetic field detection element calibration unit determines whether an updated correspondence is within a permitted range defined in relation to the known correspondence, and if it is determined that the updated correspondence is outside the permitted range, the control unit prohibits or suspends an ion implantation process.

3. The ion implanter according to claim 1, wherein the magnetic field measurement unit converts the measurement output into a measurement of the deflecting magnetic field in accordance with the known correspondence, and the control unit comprises a magnetic field adjustment unit configured to adjust the deflecting magnetic field to a target magnetic field based on the measurement of the deflecting magnetic field.

4. The ion implanter according to claim 1, wherein the control unit updates the correspondence based on the NMR output independently of measuring and/or adjusting the deflecting magnetic field in accordance with the correspondence.

5. The ion implanter according to claim 1, wherein one of the pair of electromagnets comprises a first magnetic pole surface that is flat, and the other of the pair of electromagnets comprises a second magnetic pole surface that is flat, the second magnetic pole surface facing the first magnetic pole surface and parallel to the first magnetic pole surface, and the nuclear magnetic resonance probe is located on the first magnetic pole surface or the second magnetic pole surface.

6. The ion implanter according to claim 1, wherein the nuclear magnetic resonance probe is located immediately above or immediately below the ion beam orbit.

7. The ion implanter according to claim 1, wherein the magnetic field detection element generates the measurement output at a frequency higher than a frequency with which the nuclear magnetic resonance probe generates the NMR output.

8. The ion implanter according to claim 1, wherein the magnetic field detection element comprises a Hall probe.

9. The ion implanter according to claim 1, wherein the deflecting electromagnet is an energy analyzer electromagnet.

10. A magnetic field measurement device adapted for a deflecting electromagnet configured to form a deflecting magnetic field for deflecting a charged particle beam, the magnetic field measurement device comprising:
    a magnetic field detection element provided in the deflecting electromagnet so as to output a measurement output in response to the deflecting magnetic field;
    a nuclear magnetic resonance probe provided in the deflecting electromagnet so as to generate an NMR output; and
    a control unit including:
        a magnetic field measurement unit configured to measure the deflecting magnetic field in accordance with a known correspondence between the deflecting magnetic field and the measurement output,
        a magnetic field determination unit configured to determine the deflecting magnetic field from the NMR output;
        a magnetic field detection element calibration unit configured to determine whether a condition to start calibration is met and configured to update the known correspondence by using the deflecting magnetic field determined from the NMR output and a new measurement output of the magnetic field detection element corresponding to the determined deflecting magnetic field, and
        a storage configured to store a calibration data representing the known correspondence, wherein
    the magnetic field detection element calibration unit is configured such that, if the condition to start calibration is not met, the calibration is not updated and remains stored in the storage and such that, if the condition to start calibration is met, the calibration data is updated.

11. An ion implantation method comprising:
    transporting an ion beam from an ion source to a workpiece;
    forming a deflecting magnetic field for deflecting the ion beam by using a deflecting electromagnet provided between the ion source and the workpiece;
    generating a measurement output in response to the deflecting magnetic field, by using a magnetic field detection element provided in the deflecting electromagnet;
    measuring the deflecting magnetic field in accordance with a known correspondence between the deflecting magnetic field and the measurement output;
    determining the deflecting magnetic field by using a nuclear magnetic resonance probe provided in the deflecting electromagnet;
    determining whether a condition to start calibration is met;
    storing a calibration data representing the known correspondence in a storage; and
    updating the known correspondence by using the deflecting magnetic field determined by using the nuclear magnetic resonance probe and a new measurement output of the magnetic field detection element corresponding to the determined deflecting magnetic field,
    wherein, if the condition to start calibration is not met, the calibration data is not updated and remains stored in the storage and, if the condition to start calibration is met, the calibration data is updated.

12. The ion implanter according to claim 1, wherein the calibration data includes a plurality of plots of calibration measurement, each plot representing a certain measurement output from the magnetic field detection element and a true deflecting magnetic field determined from the NMR output corresponding to the certain measurement output, and
the magnetic field detection element calibration unit is configured to update the calibration either by adding a new plot of calibration measurement to the calibration data or by replacing one of the plurality of plots of calibration measurement with the new plot of calibration measurement.

* * * * *